WIDE-RANGE TUNER MECHANISM

Filed Sept. 30, 1957 2 Sheets-Sheet 1

INVENTOR.
Harold T. Lyman
BY
Coms, McDougall, Williams & Hersh
Attorneys

WIDE-RANGE TUNER MECHANISM

Filed Sept. 30, 1957

INVENTOR.
Harold T. Lyman
BY
Oons, McDougall, Williams & Hersh
Attorneys

United States Patent Office 2,920,199

Patented Jan. 5, 1960

2,920,199

WIDE-RANGE TUNER MECHANISM

Harold T. Lyman, Milford, Conn., assignor to Aladdin Industries, Incorporated, Nashville, Tenn., a corporation of Illinois Application September 30, 1957, Serial No. 687,142

10 Claims. (Cl. 250—40)

This invention relates to tuning mechanism for use in radio equipment, television equipment, and the like. It is particularly directed to a tuning apparatus in which, by a single tuning movement, an extraordinarily wide range of frequencies can be covered. As illustrative of the wide frequency ranges that can be achieved with my invention, I shall specifically describe herein a tuner which will cover the range between 30 mc./s. and 1,000 mc./s. in a single tuning movement.

The achievement of such a tuner, capable of tuning continuously over a frequency range of thirty-to-one or more, is the principal object of the present invention.

In achieving this primary object, I likewise attain the secondary object of providing a wide-range tuner which is free of "dead spots," drag loops, and other spurious tuning effects heretofore frequently encountered whenever an attempt was made to tune over wide ranges without switching or coil changing.

A further object of the invention is to provide a tuner mechanism in which tuning is accomplished by movement of an adjustable plunger capacitively coupled to one or more coils, movement of the plunger varying the quantity of effective inductance. A particularly important feature and object of the present invention resides in my providing a second plunger which moves coordinately with the main tuning plunger and which effectively de-tunes the unused portion of the tuning inductor, at all settings of the main plunger. Unwanted and unplanned resonances occurring in the unused portions of adjustable inductors have been the principal cause of dead spots and erratic behavior in prior wide-range tuners.

Among the other special features and objects of this invention are my use of inductors having nonuniform winding pitch so designed as to permit uniform spacing of the two aforementioned plungers throughout the entire tuning range of the apparatus. When such inductors are used, the two plungers which form a part of my invention can be banged together and moved uniformly by a single drive mechanism.

In applications wherein some other inductor design is desirable, the two plungers employed in my invention may be independently moved, appropriate coordinate motion being provided by suitable differential drive mechanism of conventional type. I have, in the following specification, shown such an alternative embodiment of my invention.

Another object of the present invention is to provide a wide-range tuner in which the R.-F. field is wholly shielded at all settings of the tuning mechanism, so that its tuning characteristics are essentially unaffected by external circuit elements and fields.

Other objects and advantages of the invention will appear from the following description of illustrative embodiments thereof.

Figures 1, 2, 3, 4:
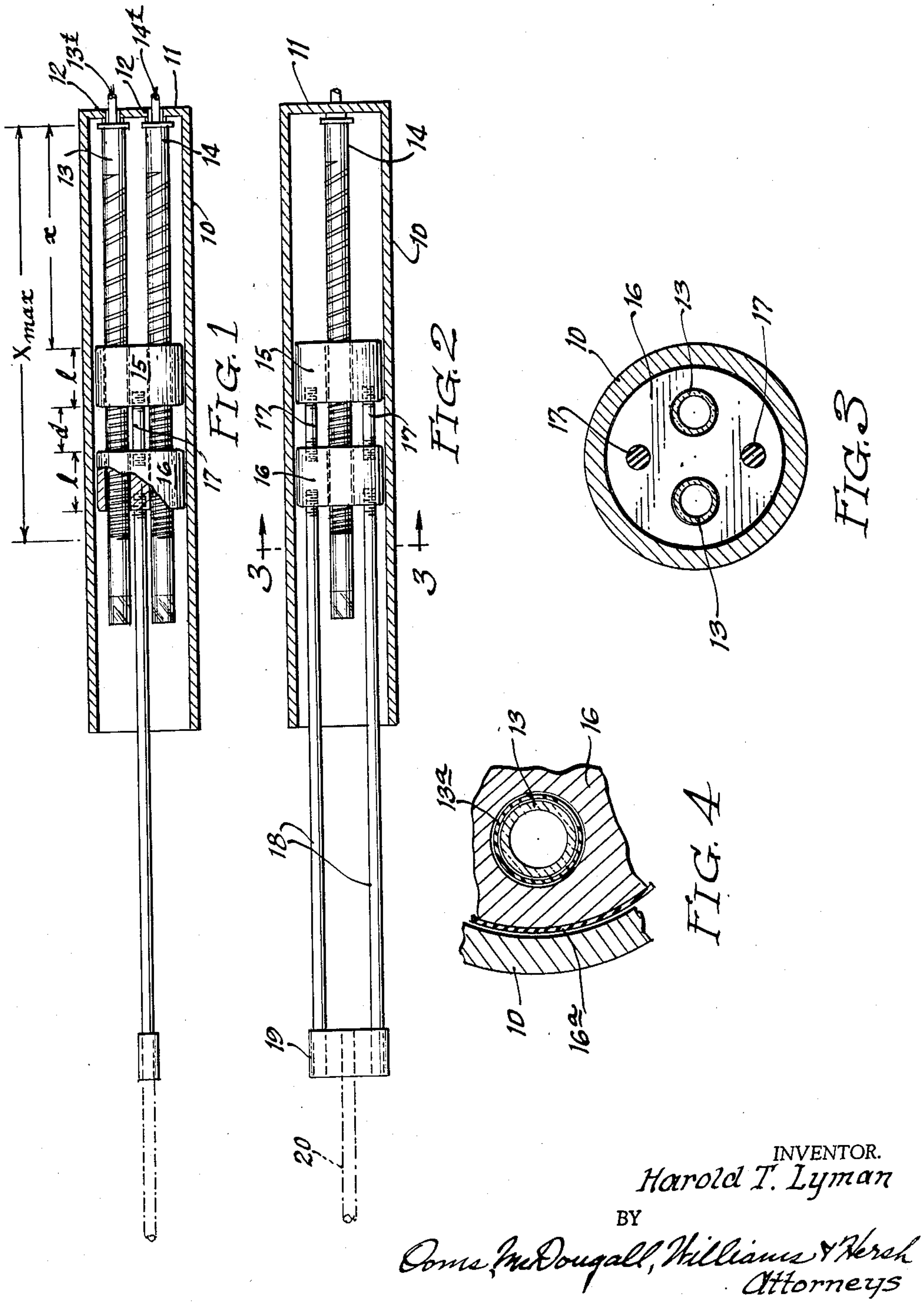
Figure 5:
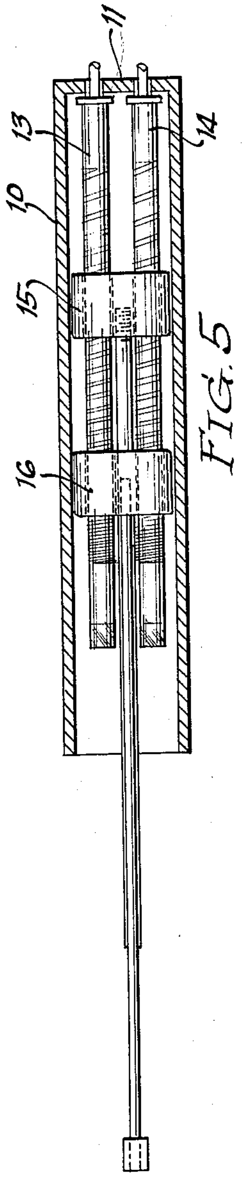
Figure 6:
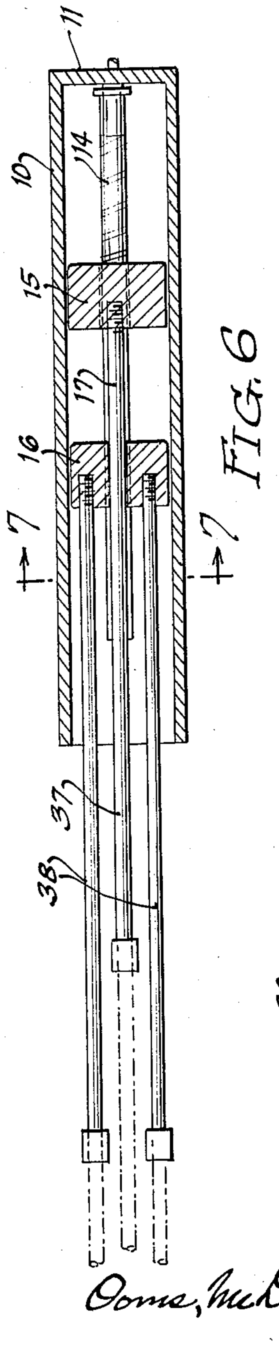
Figure 8:
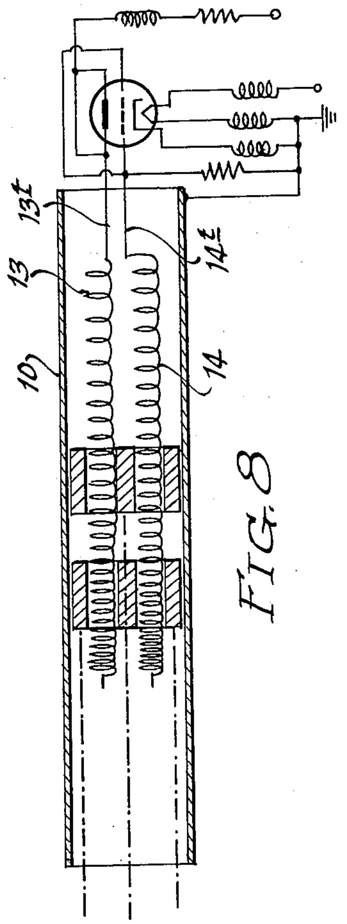
Figure 7:
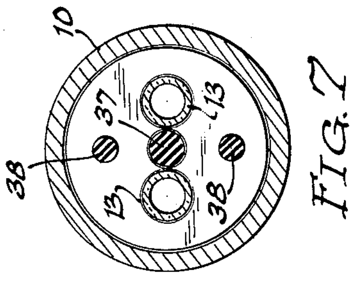

In the appended drawing, I have shown in Figure 1 a view, partly in section, of a typical tuner embodying my invention. Fig. 2 is a view generally like Fig. 1, except that the section is taken at right angles to that of Fig. 1, thus bringing out certain additional structural features. Fig. 3 is a transverse sectional view of the Fig. 1 tuner, taken along the line 3—3 of Fig. 2. Fig. 4 is an enlarged fragmentary view, bringing out in detail the positional and structural relationships of certain important parts of my tuner. Figs. 5 and 6 are views, partly in longitudinal section, of an alternative embodiment of my invention, the respective views shown in Figs. 5 and 6 corresponding to the views in Figs. 1 and 2. Fig. 7 is a transverse sectional view along the line 7—7 of Fig. 6, bringing out the manner in which the two plungers of the Fig. 5 embodiment may be independently adjusted. Fig. 8 is a diagrammatic and schematic view of a tuner embodying my invention, showing a typical application thereof in a vacuum-tube oscillator.

I shall now describe and discuss the embodiment of my invention shown in Figs. 1–4.

The tuner is enclosed in a metallic cylinder 10 having one end open and having the other end closed off by a wall 11 which is perforated by apertures 12 to permit egress of external circuit connections and to afford a means for anchoring inductance coils 13 and 14.

The coils 13 and 14 are preferably formed of copper or silver turns deposited on forms made of glass or ceramic material. Such coils can be made inexpensively by printed-circuit techniques. The outer surface of each of the coils 13 and 14 is covered with a thin dielectric coating of a hard, low-loss plastic such as Teflon; such coating on coil 13 is shown in Fig. 4 and marked 13*a*.

Disposed within the cylinders 10 are a pair of spaced metal plungers 15 and 16, preferably made of solid copper, silver, or other high-conductivity metal. As may be seen from Figs. 1, 3, and 4, the plungers 15 and 16 are cylindrical in shape and are provided with a pair of spaced axial bores dimensioned to fit over the coils 13 and 14. The plungers 15 and 16 are also provided with threaded apertures on their respective inner faces which receive threaded spacing rods 17, rods 17 being made of a suitable hard, low-loss plastic such as Teflon or one of the styrenes or epoxy plastics. The rear plunger 16 is also provided on its outer face with threaded apertures which receive a pair of adjusting rods 18, also made of low-loss insulating material of the same sort as spacing rods 17. At their outer ends, the rods 18 may be joined by a suitable coupling 19 which receives also a control rod 20. Since control rod 20 is at all times outside the cylinder 10, it may, if desired, be made of metal, although it may also be formed of insulating material.

It should also be understood that the present invention is directed to the electrical components of the tuner mechanism, rather than to the mechanical drive means used for adjusting it. Therefore, the control rod 20 may be regarded as merely illustrative of any type of control mechanism which can be used to move the rods 18 in and out of the cylinder 10, thereby sliding the plungers 15 and 16 therewithin.

The outer cylindrical surfaces of the plungers 15 and 16 are covered with a thin coating of hard plastic such as Teflon, such coating being indicated in Fig. 4 by the reference numeral 16*a*. The outer diameter of the plungers, with their plastic coatings, are designed to be smaller than the inner diameter of cylinder 10 by a few thousandths of an inch, permitting easy sliding movement of the plungers within the cylinder. Similarly, the apertures in the plungers through which the coils 13 and 14 pass are designed to provide a similar clearance of from one thousandth of an inch to perhaps two thousandths of an inch, again permitting easy sliding movement of the plungers over the surfaces of the coils.

In the embodiment shown in Figs. 1–4, the coils 13 and 14 are designed with progressively increasing pitch. That is, the pitch of the windings, from the left ends of the coils as viewed in Fig. 1 toward the right ends thereof, increases geometrically. Stated mathematically, the pitch on each part of the coil may be expressed by the equation:

$$P=k^{(X_{max}-X)}$$

where P is the pitch, $X_{max}$ is the total winding length, and X is the portion of the winding under consideration, measured from the end of the coil mounted on wall 11, and *k* is a constant.

When an external radio-frequency circuit, such as an oscillator, is connected to the external terminals **13*t* and 14*t* of coils 13 and 14 respectively, the portion of the coils which is primarily in circuit as a frequency-determining element is the portion lying between wall 11 and the leading face of plunger 15. While there is no conductive relation between the plunger 15 and either the coils 13 and 14 or the cylindrical shield 10, the capacitance which exists across the thin dielectric coatings around the coils and the plunger 15 provides an extremely low-impedance path for R.-F. currents, with the result that the portions of coils 13 and 14 which lie within and to the left of plunger 15** are, for most purposes, shorted out of the circuit.

This arrangement is schematically illustrated in Fig. 8, wherein a tuner embodying my invention is represented in circuit with a vacuum tube 50, connected thereto as an oscillator. As may be seen from that figure, the cylindrical shield enclosure 10 is at R.-F. ground potential, and the coil terminals are respectively connected to the grid and plate of the vacuum tube 50.

Referring again to Figs. 1–4, as well as to Fig. 8, I shall now discuss the function of plunger 16, which constitutes an important part of my invention.

Because no perfect electrical conductor exists in nature, the plunger 15 does not completely isolate from the tuner circuit the portion of the coils 13 and 14 which lie behind it. Inevitably a certain amount of coupling can and will occur via currents flowing in the wall of cylindrical shield 10 and in the plunger 15. This coupling is not normally of any practical importance, since, in general, no significant amount of energy is removed thereby from the active portion of the circuit. If, however, the portions of the coils lying to the left of plunger 15 happen to resonate at the same frequency as the parts of the coils which are actively in circuit, the energy transfer between the active and the inactive parts of the apparatus is greatly increased, resulting in sharply lowered circuit "Q" and producing a "dead spot" at which the circuit is wholly or largely inoperative.

Such unwanted resonance phenomena, producing deleterious coupling effects between active and shorted-out turns of a coil, have been long known to tuner engineers, and they have seriously hampered prior development of wide-range tuners.

One possible technique for suppressing such resonance effects has consisted in using a very long energy-transfer ring, of sufficient size to envelop entirely the portion of the tuning coil which is not in use. As applied to the tuner of Fig. 1–4, this would consist in making plunger 15 sufficiently long to envelop wholly the portions of coils 13 and 14 lying to the left of its leading edge, as viewed in Fig. 1. This is not, however, a satisfactory solution in most cases, for the reason that tuning arrangements using such long plungers exhibit a circuit "Q" which is too low for satisfactory performance in R.-F. circuits. Furthermore, when such long plungers are employed, spurious resonances sometimes occur in the turns enveloped by the plunger with the same bad effect on circuit performance at the affected frequency.

In the present invention, I have solved this problem by providing the second plunger 16, which is spaced away from the main tuning plunger 15 and which acts as a controlled de-tuning device to prevent the development of spurious resonanecs in the unused portions of the tuning coils.

In tuners wherein the pitch of the coil turns increases geometrically, in general conformity with the above-mentioned formula, the spacing between the main tuning plunger 15 and the resonance-suppressor plunger 16 can be fixed for all settings of the tuning plunger. This spacing (marked "*d*" on Fig. 1) should be such that the part of the coils lying between the two plungers represents approximately—preferably slightly less than—one-half electrical wavelength at the frequency defined by the position of plunger 15. On a coil whose pitch varies geometrically, this optimum spacing of slightly under one-half electrical wavelength proves to be almost constant over the entire coil length. As a result, when such a coil is employed, the simple arrangement shown in Figs. 1–4 can be used, wherein the plungers 15 and 16 are mechanically linked together by the spacer rods 17 and are moved as a unit by the rods 18.

The plungers 15 and 16 should not be separated by very much more than an electrical one-half wavelength; otherwise, spurious resonances and dead spots are likely to occur. Similarly, they should not be brought much closer together than slightly under an electrical one-half wavelength; otherwise ambiguity of tuning and undue electrical loading can be expected to take place in portions of the tuning range.

In other words, spacing of the plungers beyond the optimum will produce spurious resonances, while spacing substantially less than the optimum value will reduce circuit "Q" and produce erratic tuning.

The length of the plungers 15 and 16, while not critical, should be held at about the minimum value which will afford adequate capacitive coupling between the coils 13 and 14 and between the coils and shield 10. The plunger length adopted in any given embodiment will depend to some extent on the frequency range to be covered, since a greater amount of coupling capacitance is needed at HF and low VHF frequencies than at frequencies in the high VHF or UHF region. In tuners which are not expected to operate below the VHF region, plunger lengths in the neighborhood of ⅜ inch to ½ inch are usually satisfactory. If the tuner is to be employed at frequencies in the low VHF or HF region, the plunger length may be in the neighborhood of 1 inch.

The objection to using plungers of excessive length is that current is caused thereby to flow through a greater number of turns than necessary, with the result that circuit losses are raised and the "Q" lowered.

The particular embodiment of my invention shown in Figs. 1–4 is a tuner designed for continuous tuning over a frequency range of 30 mc./s. to 1,000 mc./s. The dimensions of that tuner will be here given as illustrative of typical design. Because such dimensional factors will vary greatly according to the application, however, it is to be understood that these values are merely illustrative and not limiting:

| | |
|---|---|
| Plunger length | **1 inch.** |
| Plunger spacing | **Approx. 1⅟₁₆ inch.** |
| Shield **10** | Length 10½ inches, inner diameter 1⁹⁄₁₆ inches. |
| Coil length | **Approx. 8½ inches.** |
| Coil diameter | **⅜ inch.** |
| Coil spacing | **Center-to-center ¾ inch.** |
| Total plunger travel for full range | **Approx. 6 inches.** |

As I have previously indicated, the use of coils having progressively increasing pitch will permit the use of constant spacing between the tuning plunger 15 and the resonance-suppressing plunger 16. In some applications, however, it is inconvenient or undesirable to employ coils having progressively increasing pitch. For example, it is sometimes desirable to "spread out" the tuning of certain frequency ranges of particular interest and to tune over intermediate ranges of frequency with only a short plunger movement. In such situations, the optimum spacing between the tuning plunger 15 and the resonance suppressor 16 will not be uniform through the tuning range, and the two plungers should accordingly be separately adjustable. A suitable differential drive mechanism, of which many are known to the art, should be provided to move the two plungers in the appropriate manner to maintain the optimum spacing of approximately one-half wavelength throughout the tuning range.

In Figs. 5–7, I show a modified tuner permitting such differential movement of the plungers.

Since the tuner of Figs. 5–7 is generally similar to the tuner of Figs. 1–4, I have employed the same reference numerals therein to indicate corresponding parts. Thus, in the embodiment of Figs. 5–7, I show a cylindrical shield 10 having end wall 11 and coils 13 and 14, mounted as in the Fig. 1 embodiment. Similarly, I show a tuning plunger 15 and a resonance-suppressing plunger 16, arranged to slide within the cylindrical shield 10 and over the coils 13 and 14.

In the Fig. 5 embodiment, however, the plungers 15 and 16 are not ganged together. Instead, plunger 15 is provided with a control rod 37, made of insulating material, which passes through a central aperture in the resonance suppressor 16 and extends externally from the open end of the shield 10. Resonance-suppressor plunger 16 is provided with a pair of control rods 38, made of insulating material, which likewise extend externally of the shield 10 through its open end.

By appropriate axial movement of the rod 37, tuning plunger 15 may be adjusted, while independent adjustment of the resonance suppressor 16 may be achieved by axial movement of the rods 38.

Cam drives and other types of differential drive mechanisms for achieving any desired relative axial movement of the rods 37 and 38 are well known in the art, and, since such drives are not part of this invention, no specific drive mechanism will be herein described.

While both of the embodiments of my invention herein described are tuners of the balanced type, in which a pair of coils are disposed symmetrically with reference to a grounded shield enclosure, it should be understood that this is a matter of design, it being possible if desired to employ my invention in a single-ended tuner having only one coil enclosed within the shield. Other variations in matters of design will occur to persons skilled in the art within the scope and spirit of my invention. Thus, while I have herein shown my coils, plungers, and shield members as having circular cross section, other types of cross sections may be employed if desired. Therefore, it is to be understood that the terms "cylindrical," "helical," and the like, as employed in the appended claims, are not limited to configuratons of circular cross section. Similarly, the other terms in the appended claims are intended to embrace not only the exact structure shown in the drawings but also their equivalents.

I claim:

1. A tuner mechanism comprising a cylindrical metallic shield, a helical coil disposed therewithin with its axis parallel to the axis of said shield, a metallic tuning plunger apertured to fit over said coil and dimensionally proportioned to slide within said shield, thin insulating means disposed between said plunger and said coil and between said plunger and said shield, defining capacitive energy-transfer paths between said coil and said plunger and between said plunger and said shield, a second plunger disposed within said shield and overlying said coil, said second plunger being spaced away from said tuning plunger, and means for sliding said tuning plunger and said second plunger in spaced relationship over said coil within said shield for varying the resonant frequency of said tuner, said plungers being insulated from each other.

2. An R.-F. tuner comprising a cylindrical metallic shield, a helical tuning coil mounted therein, means for making an electrical connection to one end of said coil, an apertured metallic plunger adapted to slide over said coil and dimensioned for a sliding fit within said shield, thin insulating means disposed between said plunger and said coil and between said plunger and said shield, defining capacitive energy-transfer paths between said coil and said plunger and between said plunger and said shield, a second plunger disposed within said shield and overlying siad coil, said second plunger being spaced away from said first plunger on the opposite side thereof from said aforementioned coil end, and means for coordinately moving said plungers in spaced-apart relation along said coil for tuning the part of said coil lying between said aforementioned coil end and said first plunger and detuning the portion of said coil disposed on the opposite side of said first plunger from said aforementioned coil end, said plungers being insulated from each other.

3. The apparatus of claim 2 wherein the winding pitch of said coil progressively increases along the major portion thereof, the maximum winding pitch being adjacent said aforementioned coil end.

4. The apparatus of claim 2 wherein said moving means maintains said second plunger spaced apart from said tuning plunger throughout a substantial part of the range of movement of said tuning plunger at a distance approximately equal to one-half electrical wavelength at the frequency defined by the position of said tuning plunger on said coil.

5. The apparatus of claim 2 wherein the winding pitch of said coil progressively increases along the major portion of its length, the maximum winding pitch being located adjacent said aforementioned coil end, said winding pitch increasing throughout said major portion in substantial accordance with the formula $$P=k^{(X_{max}-X)}$$

where P is the winding pitch at any point on said coil within said major portion, $X_{max}$ is the total length of said major portion, and X is the distance between said point and the end of said major portion nearest said aforementioned coil end, $k$ being a constant.

6. Apparatus according to claim 5 wherein said moving means is operative to maintain said plungers uniformly spaced apart in ganged relation, the spacing between said plungers being approximately equal to one-half electrical wavelength at the frequency defined by the position of said tuning plunger.

7. An R.-F. tuner comprising a cylindrical metallic shield, a pair of helical coils symmetrically disposed therewithin with their axes parallel to the axis of said shield, said coils being of substantially identical conformation and having at one end of each coil means for making circuit connections thereto, said coil ends being adjacent one another, a tuning plunger having a pair of axial apertures adapted to receive said coils and to slide thereover, said plunger being also dimensioned for a sliding fit within said shield, thin insulating means disposed between said plunger and each of said coils and between said plunger and said shield, defining capacitive energy-transfer paths between said respective coils and said plunger and between said plunger and said shield, a second plunger apertured and dimensioned like said tuning plunger and disposed over said coils and within said shield on the opposite side of said tuning plunger from said aforementioned coil ends, said second plunger being axially spaced apart and insulated from said first plunger, and means for coordinately moving said tuning plunger along said coils within said shield for tuning the portion of said coil between said tuning plunger and said aforementioned coil ends and maintaining the remainder of said coil de-tuned from the frequency defined by the position of said tuning plunger.

8. The apparatus of claim 7 wherein the winding pitch of said coils increases progressively along the major portion of their lengths, the winding pitch increasing toward said aforementioned coil ends adapted for circuit connections thereto.

9. The apparatus of claim 7 wherein the winding pitch of said coils increases progressively throughout the major portion of the lengths thereof, the pitch increasing in the direction toward said aforementioned coil ends adapted for circuit connections in accordance with the formula $$P=k^{(X_{max}-X)}$$

wherein P is the winding pitch at any point within said major portion, $X_{max}$ is the total length of said major portion, and X is the distance between said point and the end of said major portion whereat the pitch is maximum, $k$ being a constant.

10. Apparatus according to claim 12 wherein said moving means is operative to maintain said plungers uniformly spaced apart throughout the range of movement of said tuning plunger across said major portion of said coils, the separation between said tuning plungers being approximately equal to an electrical one-half wavelength at the frequency defined by the position of said tuning plunger.

References Cited in the file of this patent

UNITED STATES PATENTS

| | | |
|---|---|---|
| 2,331,522 | Vance | Oct. 12, 1943 |
| 2,415,736 | Flood | Feb. 11, 1947 |
| 2,528,167 | Pan et al. | Oct. 31, 1950 |
| 2,641,708 | Carlson | June 9, 1953 |
| 2,645,718 | Keizer | July 14, 1953 |
| 2,717,362 | Press | Sept. 6, 1955 |
| 2,752,494 | Finke | June 26, 1956 |
| 2,781,451 | Lyman | Feb. 12, 1957 |
| 2,786,945 | Lyman | Mar. 26, 1957 |
| 2,806,211 | Espenlaub | Sept. 10, 1957 |
| 2,819,454 | Yost | Jan. 7, 1958 |